United States Patent
Park et al.

(10) Patent No.: US 8,912,560 B2
(45) Date of Patent: Dec. 16, 2014

(54) LIGHT EMITTING DEVICE PACKAGE

(75) Inventors: Won Hwa Park, Seoul (KR); Ji Na Kwon, Seoul (KR); Hyun Kyong Cho, Seoul (KR); Ho Ki Kwon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/468,546

(22) Filed: May 10, 2012

(65) Prior Publication Data

US 2012/0319152 A1 Dec. 20, 2012

(30) Foreign Application Priority Data

Jun. 14, 2011 (KR) .................. 10-2011-0057622

(51) Int. Cl.
*H01L 33/00* (2010.01)
*B82Y 30/00* (2011.01)
*H01L 33/62* (2010.01)
*H01L 33/60* (2010.01)

(52) U.S. Cl.
CPC ............. *H01L 33/62* (2013.01); *B82Y 30/00* (2013.01); *H01L 33/60* (2013.01); *H01L 2924/0002* (2013.01)
USPC ............................... 257/98; 257/99; 257/100

(58) Field of Classification Search
CPC .................. H01L 33/46; H01L 33/60

USPC .......... 257/98–100, E33.066–67, E33.071–74
See application file for complete search history.

(56) References Cited

U.S. PATENT DOCUMENTS

| | | | |
|---|---|---|---|
| 2006/0118800 A1* | 6/2006 | Kim | 257/98 |
| 2006/0189113 A1* | 8/2006 | Vanheusden et al. | 438/597 |
| 2007/0029561 A1* | 2/2007 | Cho et al. | 257/98 |
| 2011/0169033 A1* | 7/2011 | Fukunaga et al. | 257/98 |
| 2011/0186888 A1* | 8/2011 | Chien | 257/98 |
| 2011/0186891 A1* | 8/2011 | Chien | 257/98 |

OTHER PUBLICATIONS

"Use of Thiols as Protecting Ligands in Reflective Surface Films of Silver Nanoparticles," by Faucher, et al., Journal of Nanoscience and Nanotechnology vol. 8, 3900-3908, 2008.*

* cited by examiner

*Primary Examiner* — Matthew Landau
*Assistant Examiner* — Mark Hatzilambrou
(74) *Attorney, Agent, or Firm* — KED & Associates LLP (57) ABSTRACT

Provided are a light emitting device package, a method of manufacturing the light emitting device package, and a lighting system. The light emitting device package includes a package body, an electrode layer, a reflective layer, a nano-pattern metal layer, a light emitting device, and a molding part. The electrode layer is disposed on the package body. The reflective layer is disposed over the electrode layer. The nano-pattern metal layer is disposed over the reflective layer. The light emitting device is displayed over the electrode layer. The molding part is disposed over the light emitting device.

21 Claims, 6 Drawing Sheets

LIGHT EMITTING DEVICE PACKAGE

CROSS-REFERENCE TO RELATED APPLICATIONS

This application claims under 35 U.S.C. §119 to Korean Patent Application No. 10-2011-0057622 filed on Jun. 14, 2011, which is hereby incorporated by reference in its entirety.

BACKGROUND

Embodiments relate to a light emitting device package, a method of manufacturing the light emitting device package, and a lighting system.

Light emitting devices (LEDs) convert electric energy into light energy. For instance, an LED may have various colors by adjusting a composition ratio of a compound semiconductor.

An LED package includes a light emitting chip for generating light, a lead frame for applying driving power to the light emitting chip, a housing coupled to the lead frame, and having an opening to expose the light emitting chip and a portion of the lead frame and a molding part disposed within the opening to cover the light emitting chip and the portion of the lead frame.

A silver-plated layer may be disposed on a surface of the lead frame to reflect light emitted from the light emitting chip. That is, a portion of light emitted from the light emitting chip may be directed to the surface of the lead frame, and be reflected from the silver-plated layer to the outside of the molding part. Accordingly, brightness light emitted from the LED package is improved.

However, such a silver-plated layer of a lead frame is easily oxidized by external moisture or air. Thus, when external moisture is introduced into the space between the molding part and the housing, or into the molding part, and contacts the silver-plated layer, the silver-plated layer may be oxidized. As a result, reflectivity of the silver-plated layer may be degraded to decrease brightness of light emitted from the LED package, and discolor the silver-plated layer.

SUMMARY

Embodiments provide a light emitting device package that blocks an external impurity and prevents discoloration of a reflective layer, a method of manufacturing the light emitting device package, and a lighting system.

In one embodiment, a light emitting device package includes: a package body; an electrode layer on the package body; a reflective layer over the electrode layer; a nanopattern metal layer over the reflective layer; a light emitting device over the electrode layer; and a molding part over the light emitting device.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
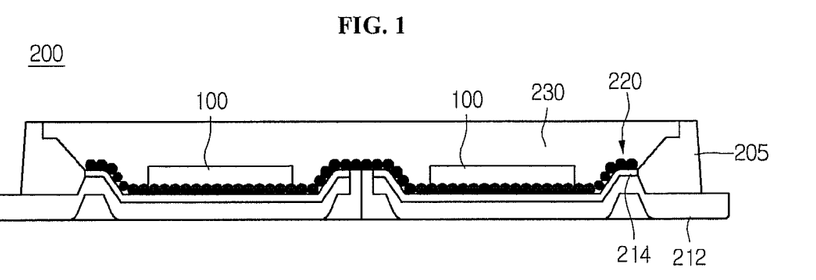
FIG. 1 is a cross-sectional view illustrating a light emitting device package according to an embodiment.

FIG. 1 is a cross-sectional view illustrating a light emitting device package 200 according to an embodiment.

The light emitting device package 200 may include: a package body 205 having a certain cavity; an electrode layer 212 on the cavity; a reflective layer 214 on the electrode layer 212; a nanopattern metal layer 220 on the reflective layer 214; a light emitting device 100 in the cavity; and a molding part 230 on the light emitting devices 100.

The electrode layer 212 and the reflective layer 214 may form a lead frame structure, but are not limited thereto. The electrode layer 212 can be protruded to an outside of the package body 205.

Since the light emitting device package 200 includes the nanopattern metal layer 220 on the reflective layer 214, the reflective layer 214 may have a uniform and wide surface area, and thus, can be securely adhered to the molding part 230.

The nanopattern metal layer 220 and the reflective layer 214 may be formed of the same type of materials. For example, when the reflective layer 214 is a silver (Ag) reflective layer, the nanopattern metal layer 220 may include a silver nanopattern, but is not limited thereto.

The nanopattern metal layer 220 may be regularly or uniformly disposed on the reflective layer 214. The nanopattern metal layer 220 is also directly disposed on a portion of the package body 205.

The nanopattern metal layer 220 may have a size smaller than a wavelength of light emitted from the light emitting device 100. For example, when nanopatterns of the nanopattern metal layer 220 have a rod or disk shape, the nanopatterns may have a size ranging from about 10 nm to about 100 nm and the size of the rod or disk shape may be a diameter of the cross-section for the rod shape or the disk shape. When nanopatterns of the nanopattern metal layer 220 have a triangular shape, a side of the nanopatterns may have a length ranging from about 10 nm to about 100 nm. However, the size of the nanopattern metal layer 220 is not limited thereto.

For example, silver nanoparticle (NP) patterns having a size ranging from about 10 nm to about 100 nm, which is smaller than a wavelength of light emitted from a light emitting diode (LED), may be formed on the reflective layer 214, thereby preventing discoloration of the light emitting device package 200, and improving light extraction efficiency thereof.

The nanopatterns of the nanopattern metal layer 220 may have uniform sizes or arbitrary sizes.

Accordingly, localized surface plasmon resonance (LSPR) of the nanopattern metal layer 220, which is a quasi-static state, may cause a strong reaction with light in a blue range.

The nanopattern metal layer 220 has a uniform outer surface at a nanometer scale, and thus, has a large surface area to improve adhesion between the reflective layer 214 and the molding part 230, thereby blocking a passage through which external impurities are introduced.

In addition, according to the embodiment, a reflective region has a large surface area, thereby improving heat dissipation effect.

Figure 2:
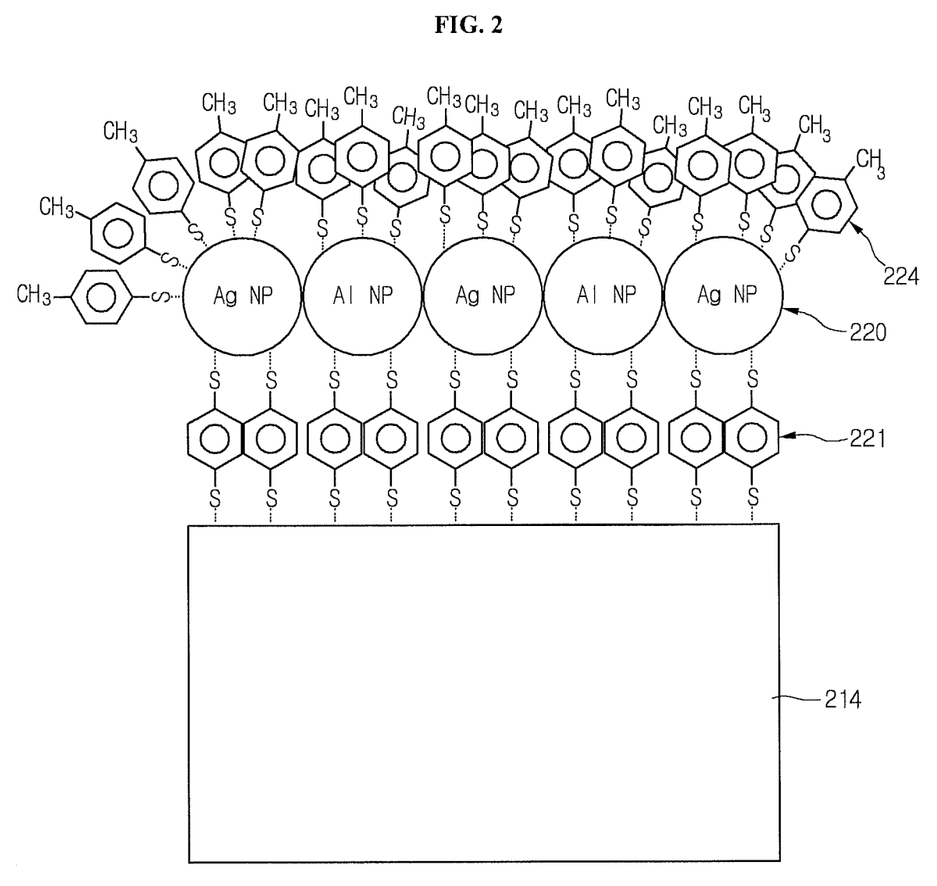
FIG. 2 is a partial enlarged view illustrating a light emitting device package according to an embodiment.

FIG. 2 is a partial enlarged view illustrating a lead frame region of a light emitting device package according to an embodiment.

According to the current embodiment, a nano thin layer 221 is disposed on the reflective layer 214, and the nanopattern metal layer 220 is disposed on the nano thin layer 221.

For example, before Ag nanoparticles are applied in the form of a nanopattern, the nano thin layer 221 may be formed on the reflective layer 214 by thiol bonding as chemical bonding of linker molecules. A thiol is an organosulfur compound that contains a carbon-bonded sulfhydryl (—C—SH or R—SH) group (where R represents an alkane, an alkene, or a carbon-containing group of atoms).

When the Ag nanoparticles are applied in the form of a nanopattern on the reflective layer 214 through vacuum deposition, a process of forming the nano thin layer 221 functioning as a liker may be unnecessary.

After the Ag nanoparticles are applied in the form of a nanopattern, a coating layer 224 may be formed by coating molecular bonding, which is highly hydrophobic.

For example, a coating layer may be formed by coating molecules to which a highly hydrophobic functional group is connected, e.g., by benzythiol ($C_7H_8S$) boning or aliphatic thiol bonding, so as to prevent oxidization of a surface of the nanopattern metal layer 220.

Figure 3:
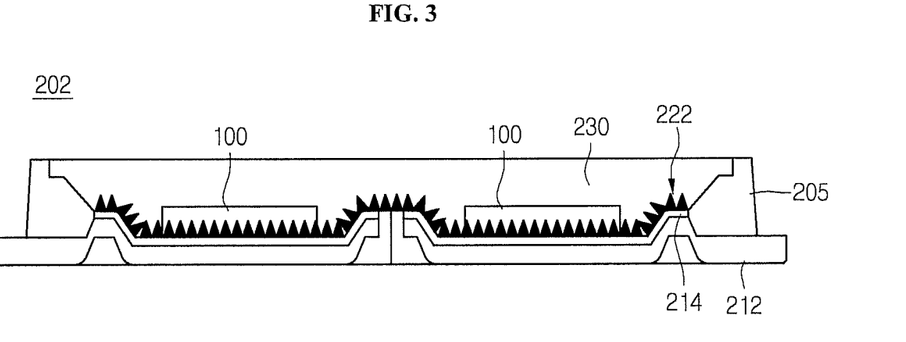
FIG. 3 is a cross-sectional view illustrating a light emitting device package according to a second embodiment.

FIG. 3 is a cross-sectional view illustrating a light emitting device package 202 according to a second embodiment.

According to the current embodiment, a scattering wavelength of a surface of a second nanopattern metal layer 222 may be controlled by changing the shape thereof. Ultimately, reflectivity within a blue and green range can be minutely optimized.

For example, the second nanopattern metal layer 222 may have a cross-section including a sharp end.

Alternatively, the second nanopattern metal layer 222 may have a polygonal cross-section including at least one corner.

Figure 4:
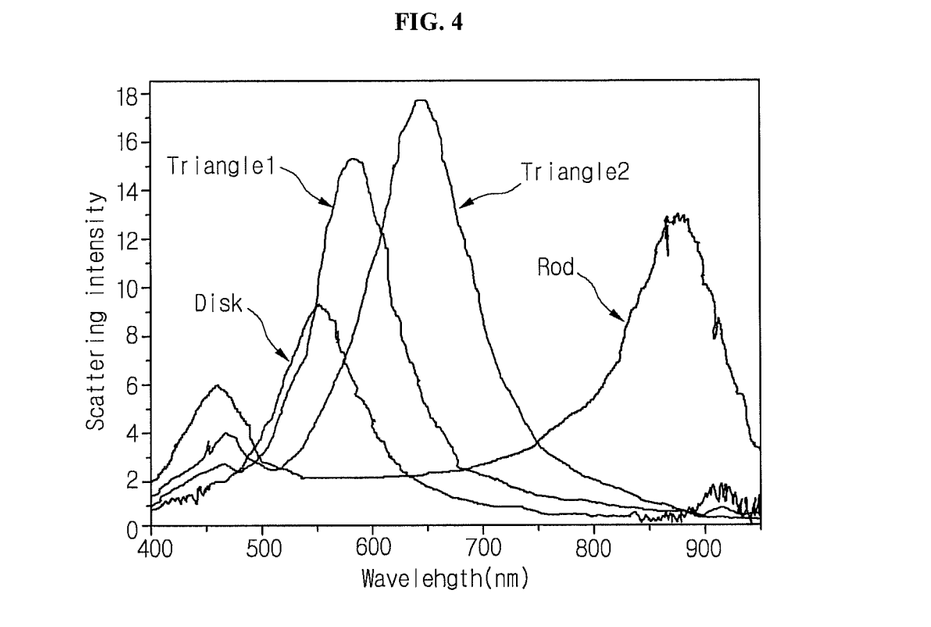
FIG. 4 is a graph illustrating scattering intensity of a light emitting device package according to an embodiment.

FIG. 4 is a graph illustrating scattering intensity of a light emitting device package according to an embodiment.

According to the current embodiment, when the second nanopattern metal layer 222 has a polygonal cross-section including at least one corner, such as a first triangle 1 and a second triangle 2, the second nanopattern metal layer 222 is superior in scattering intensity to the nanopattern metal layer 222 having a rod or disk cross-section. This is because light is confined at the corner to increase plasmon resonance effect. The second triangle 2 is one being the larger of the two.

The cross section of the second nanopattern metal layer 222 is not limited to a triangular shape, and thus, may have a star or cubic shape.

According to the embodiment, since nanopatterns are regularly formed on a lead frame, a reflective layer has a uniform and wide surface area, and thus, can be securely adhered to an outer molding part.

In addition, the nanopatterns are regularly formed on the lead frame, thereby preventing introduction of external impurities, and discoloration of the reflective layer.

In addition, since the reflective layer has a wide surface area, heat dissipation efficiency thereof is improved.

Hereinafter, a method for manufacturing a light emitting device package 202 according to an embodiment will now be described with reference to FIGS. 5 to 8.

Figure 5:
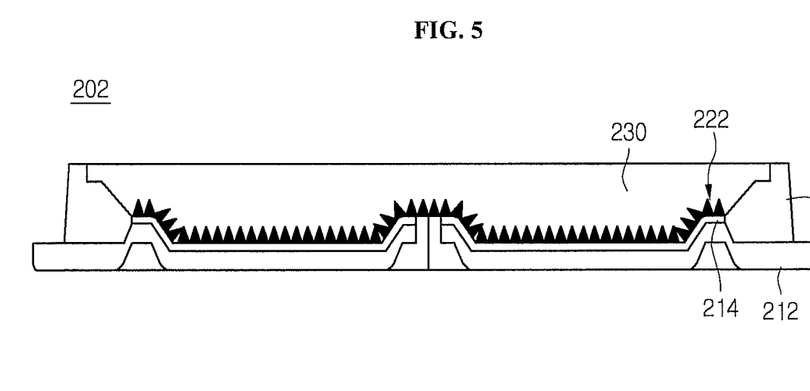
FIGS. 5 to 8 are cross-sectional views illustrating a method of manufacturing a light emitting device package according to an embodiment.

First, a package body 205 having a certain cavity is prepared as illustrated in FIG. 5.

The package body 205 may include at least one of a resin such as polyphthalamide (PPA), a silicon (Si), a metal, photo sensitive glass (PSG), sapphire ($Al_2O_3$), and a printed circuit board (PCB).

Then, a lead frame structure is formed within the cavity. The lead frame structure may include the electrode layer 212 and the reflective layer 214, but is not limited thereto.

A two cup structure having two cup shapes within the cavity is exemplified as the lead frame structure, but the lead frame structure is not limited thereto.

The electrode layer 212 may be formed of a metal having electric conductivity. For example, the electrode layer 212 may be formed of copper (Cu), but is not limited thereto.

The reflective layer 214 may be a metal reflective layer, but is not limited thereto. For example, the reflective layer 214 may be formed of Ag or Al, but is not limited thereto.

After that, the second nanopattern metal layer 222 may be formed on the reflective layer 214. The second nanopattern metal layer 222 may have a cross-section including a sharp end. Alternatively, the second nanopattern metal layer 222 may have a polygonal cross-section including at least one corner, but is not limited thereto.

The nanopattern metal layer 220 may have a spherical cross-section as illustrated in FIG. 1, or a core-shell cross-section.

Hereinafter, a process of forming a nanopattern metal layer will now be described with reference to FIG. 6.

Figure 6:
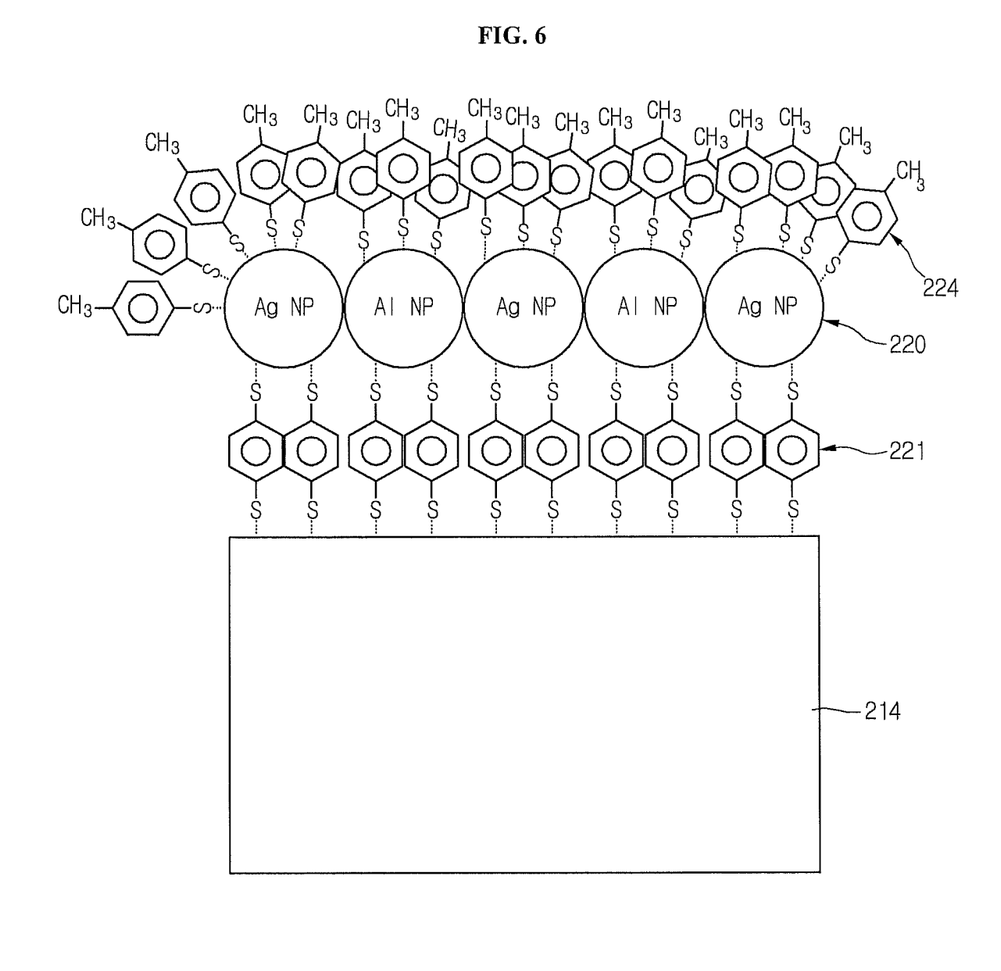

Although the nanopattern metal layer 220 is exemplified in FIG. 6, the second nanopattern metal layer 222 may be also exemplified.

The nano thin layer 221 may be formed on the reflective layer 214, and the nanopattern metal layer 220 may be formed on the nano thin layer 221.

For example, before Ag nanoparticles are applied in the form of a nanopattern, the nano thin layer 221 may be formed on the reflective layer 214 by thiol bonding as chemical bonding of linker molecules.

For example, when the reflective layer 214 is formed of Ag, the reflective layer 214 may be strongly linked to Ag nanoparticles (NP). To this end, the nano thin layer 221 may be formed of a material based on 1,4-dibenzenthiol ($C_6H_6S_2$) or aliphatic dithiol as linker molecules to form thiol bonding as chemical bonding.

When the Ag nanoparticles are applied in the form of a nanopattern on the reflective layer 214 through vacuum deposition, a process of forming the nano thin layer 221 functioning as a liker may be unnecessary.

After the Ag nanoparticles are applied in the form of a nanopattern, the coating layer 224 may be formed by coating molecular bonding, which is highly hydrophobic.

For example, the coating layer 224 may be formed by coating molecules to which a highly hydrophobic functional group is connected, e.g., by benzythiol ($C_7H_8S$) boning or aliphatic thiol bonding, so as to prevent oxidization of the surface of the nanopattern metal layer 220.

The nanopattern metal layer 220 and the reflective layer 214 may be formed of the same type of materials. For example, when the reflective layer 214 is a silver (Ag) reflective layer, the nanopattern metal layer 220 may include a silver nanopattern, but is not limited thereto.

The nanopattern metal layer 220 may have a size smaller than a wavelength of light emitted from the light emitting device 100. For example, when the nanopattern metal layer 220 may have a size ranging from about 10 nm to about 100 nm.

For example, silver nanoparticle (NP) patterns having a size ranging from about 10 nm to about 100 nm, which is smaller than a wavelength of light emitted from a light emitting diode (LED), may be formed on the reflective layer 214, thereby preventing discoloration of the reflective layer 214, and improving the light extraction efficiency thereof.

Accordingly, localized surface plasmon resonance (LSPR) of the nanopattern metal layer 220, which is a quasi-static state, may cause a strong reaction with light in a blue range.

The nanopattern metal layer 220 has a uniform outer surface at a nanometer scale, and thus, has a large surface area to improve adhesion between the reflective layer 214 and the molding part 230, thereby blocking a passage through which external impurities are introduced.

In addition, according to the embodiment, a reflective region has a large surface area, thereby improving heat dissipation effect.

Figure 9A:
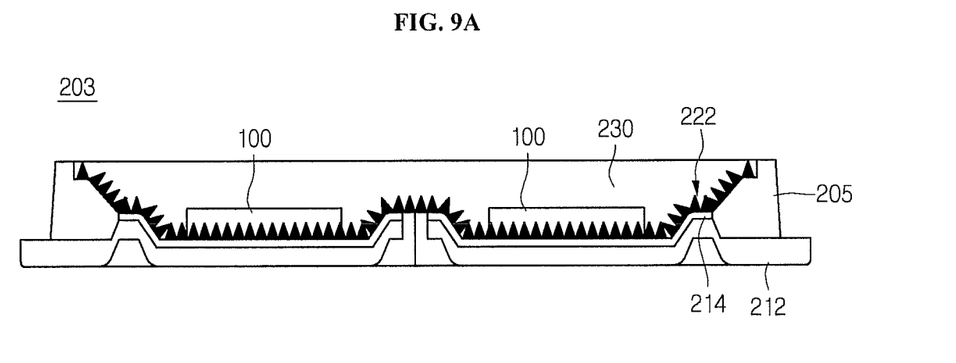
FIG. 9A is a cross-sectional view illustrating a light emitting device package according to a third embodiment.

FIG. 9A is a cross-sectional view illustrating a light emitting device package 203 according to a third embodiment. In the third embodiment, the nanopattern metal layer 220 can be formed also on a side surface of the cavity, therefore the adhesion between the package body 205 and the molding part 230 can be improved and the reflective can be more improved.

Figure 9B:
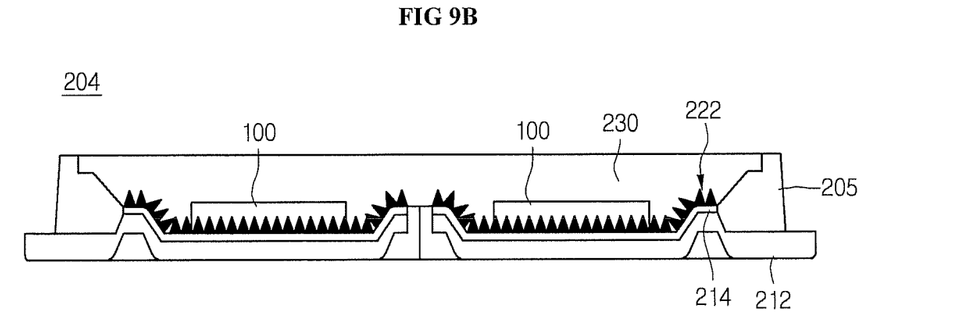
FIG. 9B is a cross-sectional view illustrating a light emitting device package according to a fourth embodiment.

FIG. 9B is a cross-sectional view illustrating a light emitting device package 204 according to a fourth embodiment. In the fourth embodiment, the nanopattern metal layer 220 can be formed only on the reflective layer 214, therefore an adhesion between the nanopattern metal layer 220 and the reflective layer 214 can be improved.

Figure 7:
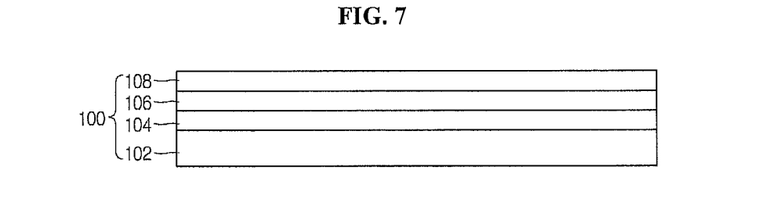
Figure 8:
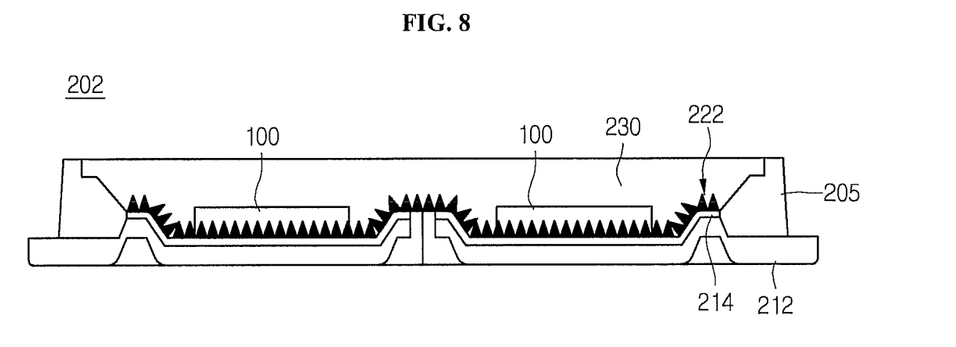

Next, the light emitting device 100 as illustrated in FIG. 7 are disposed as illustrated in FIG. 8.

For example, the light emitting device 100 may be disposed through a die paste (not shown) over the package body 205. The die paste may be a silicone paste or a silver (Ag) epoxy paste, but is not limited thereto.

Hereinafter, the light emitting device 100 will now be described with reference to FIG. 7.

The light emitting device 100 may include a second electrode layer 102, a second conductive type semiconductor layer 104, an active layer 106, and a first conductive type semiconductor layer 108, but is not limited thereto.

The second electrode layer 102 may include an ohmic layer (not shown), a reflective layer (not shown), a coupling layer (not shown), and a conductive substrate (not shown).

For example, the ohmic layer may be a multi-layer of a single metal, a metal alloy, and a metal oxide in order to efficiently inject carriers. For example, the ohmic layer may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, $IrO_x$, $RuO_x$, NiO, $RuO_x$/ITO, Ni/$IrO_x$/Au, and Ni/$IrO_x$/Au/ITO, Ag, Ni, Cr, Al, Rh, Pd, Ir, Ru, Mg, Zn, Pt, Au, and Hf, but is not limited thereto.

The reflective layer may be a metal layer including Al, Ag, or an alloy including Al or Ag. Aluminum or silver effectively reflects light emitted from an active layer to significantly improve light extraction efficiency of a light emitting device.

The coupling layer may be formed of a material such as nickel (Ni) and gold (Au).

The conductive substrate may be formed of a metal, a metal alloy, or a conductive semiconductor material, which has high electric conductivity, to efficiently inject carriers. For example, the conductive substrate may selectively include copper (Cu), copper alloy, gold (Au), nickel (Ni), copper-tungsten (Cu—W), and a carrier wafer (e.g., GaN, Si, Ge, GaAs, ZnO, SiGe, and SiC).

The first conductive type semiconductor layer 108 may be formed of a group III-V compound semiconductor doped with a first conductive type dopant. When the first conductive type semiconductor layer 108 is an n-type semiconductor layer, the first conductive type dopant may include Si, Ge, Sn, Se, or Te as an n-type dopant, but is not limited thereto.

The first conductive type semiconductor layer 108 may include a semiconductor material having a compositional formula of $In_xAl_yGa_{1-x-y}N$ ($0 \le x \le 1$, $0 \le y \le 1$, $0 \le x+y \le 1$).

The first conductive type semiconductor layer 108 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 106 may have at least one of a single quantum well structure or a multi quantum well (MQW) structure, a quantum wire structure, and a quantum dot structure. For example, the active layer 106 may have a multi quantum well structure that is formed by injecting trimethyl gallium (TMGa) gas, ammonia ($NH_3$) gas, nitrogen ($N_2$) gas, and trimethyl indium (TMIn) gas, but is not limited thereto.

Well layer/barrier layer of the active layer 106 may have a pair structure including at least one of InGaN/GaN, InGaN/InGaN, AlGaN/GaN, InAlGaN/GaN, GaAs/AlGaAs(InGaAs), and GaP/AlGaP(InGaP), but is not limited thereto. The well layer may be formed of a material having a lower band gap than that of the barrier layer.

A conductive type clad layer may be formed on at least one of the upper and lower sides of the active layer 106. The conductive type clad layer may be formed of an AlGaN based semiconductor, and may have a higher band gap than that of the active layer 106.

The second conductive type semiconductor layer 104 may include a group III-V compound semiconductor that is doped with a second conductive type dopant, e.g., include a semiconductor material having a compositional formula of $In_xAl_yGa_{1-x-y}N$ ($0 \le x \le 1$, $0 \le y \le 1$, $0 \le x+y \le 1$). When the second conductive type semiconductor layer 104 is a p type semiconductor layer, the second conductive type dopant may include Mg, Zn, Ca, Sr, or Ba as a p type dopant.

The first conductive type semiconductor layer 108 may be an n type semiconductor layer, and the second conductive type semiconductor layer 104 may be a p type semiconductor layer, but they are not limited thereto. A layer of an opposite conductive type semiconductor to the second conductive type semiconductor, e.g., an n type semiconductor layer (not shown) may be formed on the second conductive type semiconductor layer 104. Accordingly, a light emitting structure may have one of an n-p junction structure, a p-n junction structure, an n-p-n junction structure, and a p-n-p junction structure.

After that, referring to FIG. 8, wires (not shown) may be bonded to electrically connect the light emitting device 100 to the lead frame structure, and then, the molding part 230 may be formed on the light emitting device 100.

The molding part 230 may be formed by filling the cavity with an epoxy resin or a silicone resin, but is not limited thereto.

When the molding part 230 is molded, a phosphor (not shown) may be added, so that the light emitting device package 200 or 202 can emit white light. For example, a yellow phosphor (such as yttrium aluminum garnet (YAG) and terbium aluminum garnet (TAG)) may be added to a blue LED, or a red/green/blue three-colored phosphor may be added to a UV LED.

According to the embodiment, since nanopatterns are regularly formed on a lead frame, a reflective layer has a uniform and wide surface area, and thus, can be securely adhered to an outer molding part.

In addition, the nanopatterns are regularly formed on the lead frame, thereby preventing introduction of external impurities, and discoloration of the reflective layer.

In addition, since the reflective layer has a wide surface area, heat dissipation efficiency thereof is improved.

Figure 10:
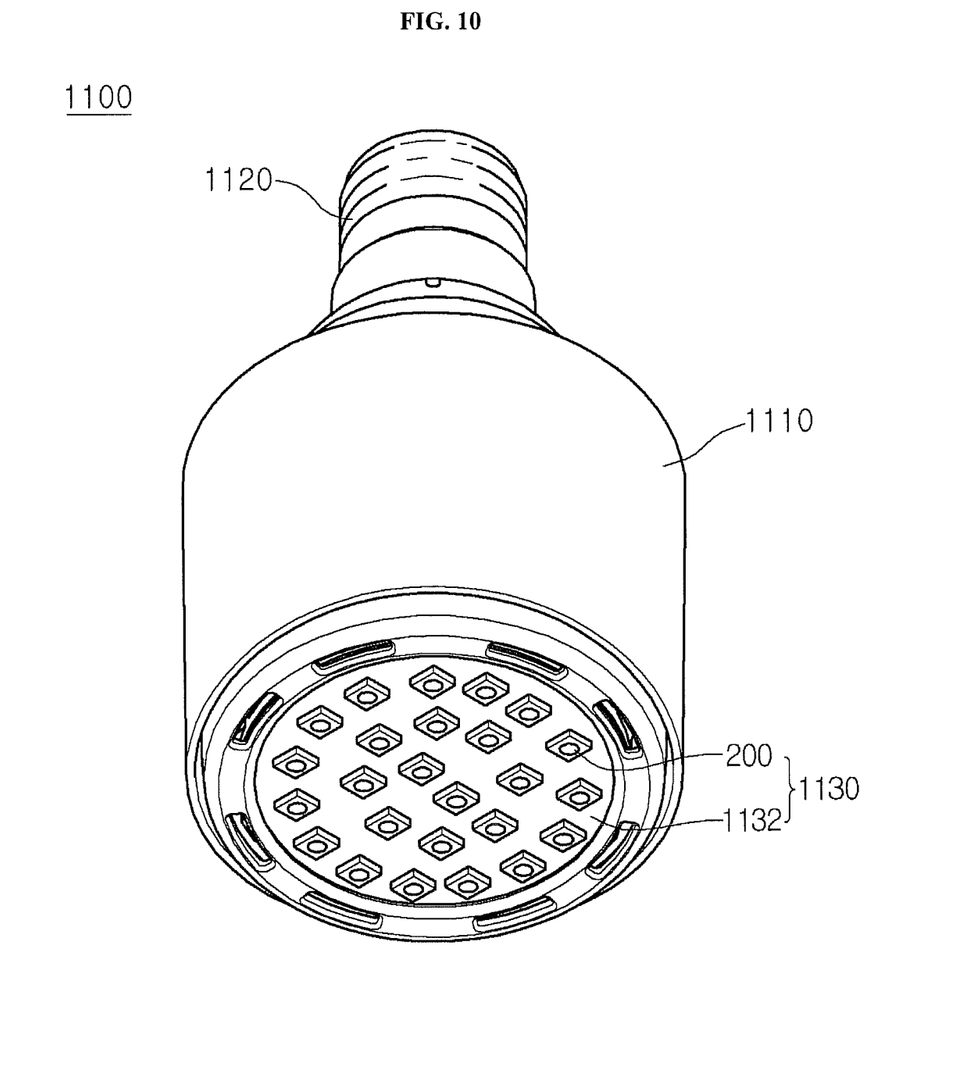
FIG. 10 is a perspective view illustrating a lighting unit according to an embodiment.
Figure 11:
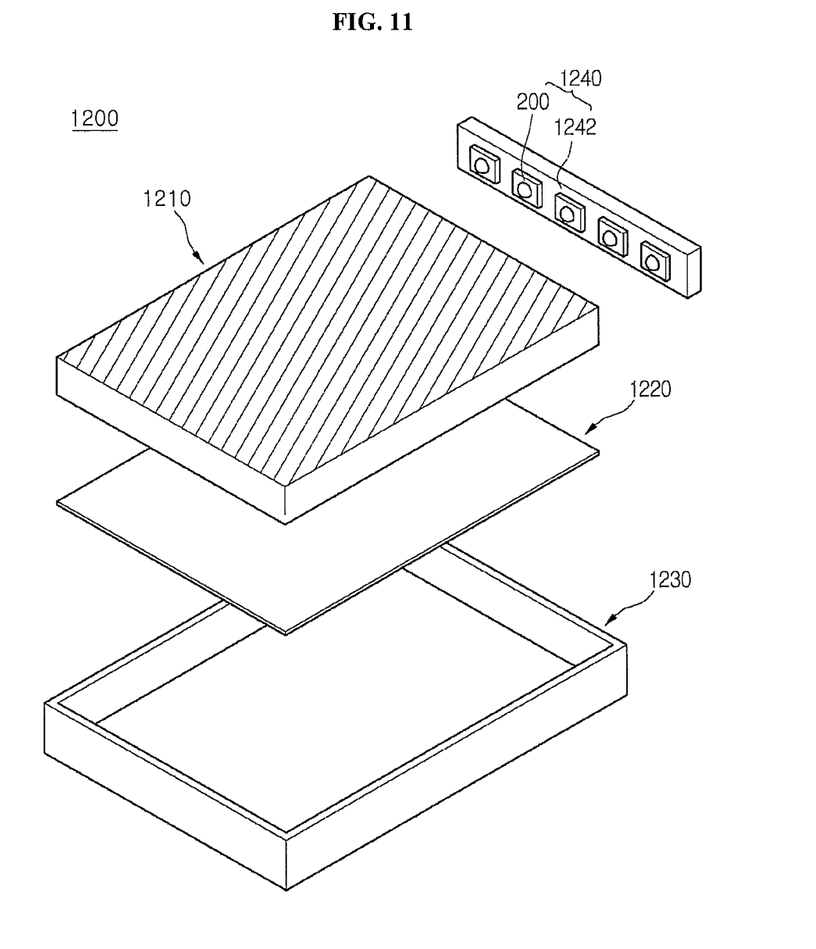
FIG. 11 is an exploded perspective view illustrating a backlight unit according to an embodiment.

A light emitting device package according an embodiment may be used in a lighting system. The lighting system may include a lighting unit as illustrated in FIG. 10, and a backlight unit as illustrated in FIG. 11. Examples of the lighting system may include traffic lights, vehicle front lamps, and signboard.

FIG. 10 is a perspective view illustrating a lighting unit 1100 according to an embodiment.

Referring to FIG. 10, the lighting unit 1100 may include a case body 1110, a light emitting module part 1130 disposed in the case body 1110, and a connecting terminal 1120 disposed in the case body 1110 to receive power from an external power source.

The case body 1110 may be formed of a material having an improved heat dissipation performance. For example, the case body 1110 may be formed of a metal or resin.

The light emitting module part 1130 may include a board 1132 and at least one light emitting device package 200 disposed on the board 1132.

A circuit pattern may be printed on an insulation material to form the board 1132. For example, the board 1132 may include a printed circuit board (PCB), a metal core PCB, a flexible PCB, or a ceramic PCB.

Also, the board 1132 may be formed of a material that can efficiently reflect light, or be coated with a colored material, e.g., a white or silver-colored material by which light is efficiently reflected.

At least one light emitting device package 200 may be disposed on the board 1132. Each light emitting device package 200 may include at least one light emitting diode (LED) as the light emitting device 100. The light emitting diode may include a colored light emitting diode that emits red, green, blue, or white light, and an ultraviolet (UV) light emitting diode that emits a UV ray.

The light emitting module part 1130 may have various combinations of the light emitting device packages 200 to obtain intended colors and brightness. For example, a combination of a white light emitting diode, a red light emitting diode, and a green light emitting diode may be used to have a high color rendering index (CRI).

The connecting terminal 1120 may be electrically connected to the light emitting module part 1130 to supply power thereto. Referring to FIG. 10, the connecting terminal 1120 is screwed in the form of a socket into an external power source, but is not limited thereto. For example, the connecting terminal 1120 may be inserted in the form of a pin into an external power source, or be connected to an external power source through a wire.

FIG. 11 is an exploded perspective view illustrating a backlight unit 1200 according to an embodiment.

The backlight unit 1200 may include: a light guide plate 1210; a light emitting module part 1240 for supplying light to the light guide plate 1210; a reflective member 1220 under the light guide plate 1210; and a bottom cover 1230 accommodating the light guide plate 1210, the light emitting module part 1240, and the reflective member 1220, but is not limited thereto.

The light guide plate 1210 spreads light to form a surface light source. The light guide plate 1210 may be formed of a transparent material, and may include, for example, one of an acrylic resin such as polymethyl metaacrylate (PMMA), polyethylene terephthalate (PET), poly carbonate (PC), cycloolefin copolymer (COC), and polyethylene naphthalate (PEN).

The light emitting module part 1240 supplies light to at least one side surface of the light guide plate 1210, and ultimately functions as a light source of a display device on which the backlight unit 1200 is installed.

The light emitting module part 1240 may contact the light guide plate 1210, but is not limited thereto. Particularly, the light emitting module part 1240 includes a board 1242 and a plurality of the light emitting device packages 200 disposed on the board 1242. The board 1242 may contact the light guide plate 1210, but is not limited thereto.

The board 1242 may be a printed circuit board (PCB) including a circuit pattern (not shown). Besides a typical printed circuit board, the board 1242 may include a metal core PCB (MCPCB) or a flexible PCB (FPCB), but is not limited thereto.

The light emitting device packages 200 may be disposed to space the light guide plate 1210 a certain distance from a light emitting surface on the board 1242.

The reflective member 1220 may be disposed under the light guide plate 1210. Light emitted through the bottom surface of the light guide plate 1210 is reflected upward by the reflective member 1220, so as to improve brightness characteristics of the backlight unit 1200. For example, the reflective member 1220 may be formed of a resin such as PET, PC, or PVC, but is not limited thereto.

The bottom cover 1230 may accommodate the light guide plate 1210, the light emitting module part 1240, and the reflective member 1220. To this end, the bottom cover 1230 may have a box shape having a top opening, but is not limited thereto.

The bottom cover 1230 may be formed a metal or resin, and be manufactured through a process such as press molding or extrusion molding.

According to the embodiment, since nanopatterns are regularly formed on a lead frame, a reflective layer has a uniform and wide surface area, and thus, can be securely adhered to an outer molding part.

In addition, the nanopatterns are regularly formed on the lead frame, thereby preventing introduction of external impurities, and discoloration of the reflective layer.

In addition, since the reflective layer has a wide surface area, heat dissipation efficiency thereof is improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a package body;
an electrode layer on the package body;
a reflective layer on the electrode layer;
a nanopattern metal layer on the reflective layer, wherein the nanopattern metal layer is contiguous such that the reflective layer is completely covered by the nanopattern metal layer;
a coating layer on the nanopattern metal layer;
a light emitting device on the electrode layer; and
a molding part on the light emitting device,
wherein the nanopattern metal layer has a size smaller than a wavelength of light emitted from the light emitting device, and the size of the nanopattern metal layer includes a diameter,
wherein the contiguous nanopattern metal layer is disposed between a bottom surface of the light emitting device and on a top surface of the reflective layer, and
wherein the contiguous nanopattern metal layer is disposed between the reflective layer and the coating layer.

2. The light emitting device package according to claim 1, wherein the nanopattern metal layer and the reflective layer are formed of the same type of materials.

3. The light emitting device package according to claim 2, wherein the nanopattern metal layer comprises silver (Ag).

4. The light emitting device package according to claim 2, wherein the nanopattern metal layer comprises a nanoparticle layer.

5. The light emitting device package according to claim 1, further comprising a nano thin layer on the reflective layer, wherein the nanopattern metal layer is disposed on the nano thin layer.

6. The light emitting device package according to claim 5, wherein the nano thin layer is formed by thiol bonding.

7. The light emitting device package according to claim 1, wherein the coating layer is formed by coating molecular bonding, which is highly hydrophobic.

8. The light emitting device package according to claim 7, wherein the coating layer is formed by benzythiol ($C_7H_8S$) bonding or aliphatic thiol bonding.

9. The light emitting device package according to claim 1, wherein the nanopattern metal layer comprises a rod shape or a disk shape, and a size of the rod shape or the disk shape includes a diameter of a cross-section for the rod shape or the disk shape.

10. The light emitting device package according to claim 9, wherein the nanopattern metal layer has a size ranging from about 10 nm to about 100 nm.

11. The light emitting device package according to claim 1, wherein the nanopattern metal layer has a cross-section comprising a sharp end.

12. The light emitting device package according to claim 1, wherein the package body comprises a cavity in which the light emitting device is disposed.

13. The light emitting device package according to claim 1, wherein the nanopattern metal layer is also directly disposed on a portion of the package body.

14. The light emitting device package according to claim 1, wherein the reflective layer is inter-disposed between a top surface of the electrode layer and a bottom surface of the nanopattern metal layer.

15. The light emitting device package according to claim 1, wherein the reflective layer comprises a first flat surface, an inclined surface extended from the first flat surface and a second flat surface extended from the inclined surface.

16. The light emitting device package according to claim 1, wherein the coating layer is directly provided on the nanopattern metal layer.

17. A light emitting device package comprising:
a package body;
an electrode layer on the package body;
a reflective layer on the electrode layer;
a nanopattern metal layer on the reflective layer, wherein the nanopattern metal layer is contiguous such that the reflective layer is completely covered by the nanopattern metal layer;
a coating layer on the nanopattern metal layer;
a light emitting device on the electrode layer; and
a molding part on the light emitting device,
wherein the nanopattern metal layer has a cross-section including a sharp end, and
wherein the nanopattern metal layer is contiguous such that all upper surfaces of the reflective layer are covered by the nanopattern metal layer.

18. The light emitting device package according to claim 17, wherein the nanopattern metal layer has a cross-section comprising a triangle.

19. The light emitting device package according to claim 17, wherein the reflective layer is inter-disposed between a top surface of the electrode layer and a bottom surface of the nanopattern metal layer.

20. The light emitting device package according to claim 17, wherein the reflective layer comprises a first flat surface, an inclined surface extended from the first flat surface and a second flat surface extended from the inclined surface.

21. The light emitting device package according to claim 17, wherein the reflective layer does not include a region that is exposed through the nanopattern metal layer.

* * * * *